(12) United States Patent
Um et al.

(10) Patent No.: US 8,420,302 B2
(45) Date of Patent: Apr. 16, 2013

(54) METHOD OF FINE PATTERNING A THIN FILM AND METHOD OF MANUFACTURING A DISPLAY SUBSTRATE USING THE METHOD

(75) Inventors: Yoon-Sung Um, Yongin-si (KR); Su-Jeong Kim, Seoul (KR); Hye-Ran You, Incheon (KR); Jae-Jin Lyu, Yongin-si (KR); Seung-Beom Park, Seoul (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 634 days.

(21) Appl. No.: 12/480,132

(22) Filed: Jun. 8, 2009

(65) Prior Publication Data

US 2010/0009295 A1    Jan. 14, 2010

(30) Foreign Application Priority Data

Jul. 10, 2008   (KR) .................................. 2008-66910

(51) Int. Cl.
  *G03F 7/20*   (2006.01)

(52) U.S. Cl.
  USPC ............................ 430/319; 430/323; 430/328

(58) Field of Classification Search ................. 430/319, 430/323, 328
  See application file for complete search history.

(56) References Cited

U.S. PATENT DOCUMENTS

| | | | |
|---|---|---|---|
| 7,023,017 B2 * | 4/2006 | Ahn et al. ..................... | 257/59 |
| 2007/0224740 A1 * | 9/2007 | Fukuda et al. ............... | 438/149 |
| 2009/0011261 A1 * | 1/2009 | Gotou ........................... | 428/469 |

* cited by examiner

*Primary Examiner* — Daborah Chacko Davis
(74) *Attorney, Agent, or Firm* — F. Chau & Associates, LLC

(57) ABSTRACT

A method of fine patterning a thin film and a method of manufacturing a display substrate by using the same, in which a fine photo pattern is formed on a base substrate, and a photoresist pattern is formed on the thin film. A fine photo pattern is formed by ashing the photoresist pattern. A fine pattern is formed by removing the thin film exposing through the fine photo pattern. A fine pattern is formed, and the fine pattern has a higher resolution than that of an exposure apparatus. The reliability of a process for manufacturing a display substrate and the display quality of a display device may be improved.

7 Claims, 12 Drawing Sheets

METHOD OF FINE PATTERNING A THIN FILM AND METHOD OF MANUFACTURING A DISPLAY SUBSTRATE USING THE METHOD

PRIORITY STATEMENT

This application claims priority under 35 U.S.C. §119 to Korean Patent Application No. 2008-66910, filed on Jul. 10, 2008 in the Korean Intellectual Property Office (KIPO), the contents of which are herein incorporated by reference in their entirety.

BACKGROUND OF THE INVENTION

1. Technical Field

Exemplary embodiments of the present invention relate to a method of fine patterning a thin film, and a method of manufacturing a display substrate. More specifically, exemplary embodiments of the present invention relate to a method of fine patterning a thin film, and a method of manufacturing a display substrate using the method.

2. Discussion of Related Art

Generally, a liquid crystal display (LCD) panel includes a display substrate having a plurality of switching elements for driving each area or pixel, an opposite substrate facing the display substrate, and a liquid crystal layer interposed between the display substrate and the opposite substrate.

The display substrate includes a gate pattern, a source pattern and a pixel electrode that are stacked thereon. The gate pattern includes a gate line and a gate electrode connected to the gate line. The source pattern includes a data line crossing the gate line, a source electrode connected to the data line and a drain electrode spaced apart from the source electrode. The pixel electrode makes contact with the drain electrode, so that the pixel electrode is electrically connected to a switching element, such as a transistor.

The gate pattern, the source pattern and the pixel electrode are typically formed through a photolithography process. For example, a photoresist pattern is formed on a thin film, and then the thin film is dry-etched and/or wet-etched by using the photoresist pattern as an etch-stop layer.

In order to form a fine pattern using the photolithography process, an exposure apparatus of high resolution should be employed for reducing the width of a pattern. Recently, the width of the pattern may be formed to at least about 2 μm by using high resolution exposure apparatus. The exposure apparatus of high resolution may be expensive, however, when replacing older exposure apparatus.

Alternatively, the width of a pattern may be reduced by increasing an amount of exposure light used in the photolithography process. As the exposure light amount is increased, however, there may be limits to reducing the width of the pattern. Moreover, the contact time of the exposure apparatus may be increased as the exposure light amount is increased, so that the process time for the photolithography process may be extended.

SUMMARY OF THE INVENTION

Exemplary embodiments of the present invention provide a method of fine patterning a thin film that is capable of improving the resolution of a pattern.

Exemplary embodiments of the present invention also provide a method of manufacturing a display substrate by using the above-mentioned method.

According to an exemplary embodiment of the present invention, there is provided a method of fine patterning a thin film. In the method, a thin film is formed on a base substrate. Then, a photoresist pattern is formed on the thin film. Then, a fine photo pattern is formed by ashing the photoresist pattern. Then, a fine pattern is formed by removing the thin film exposed through the fine photo pattern.

In an exemplary embodiment of the present invention, the width of the fine pattern may be about 0.1 μm to about 5.0 μm.

In an exemplary embodiment of the present invention, the thin film may be a metal layer, and the fine pattern may be a signal line formed in an area where the fine photo pattern is formed.

In an exemplary embodiment of the present invention, the thin film may be an insulation layer, and the fine pattern may be a contact hole exposed by the fine photo pattern and from which the insulation layer has been removed.

In an exemplary embodiment of the present invention, the thin film may be a transparent conductive layer, and the fine pattern may include a plurality of fine electrodes.

According to an exemplary embodiment of the present invention, there is provided a method of manufacturing a display substrate. In the method, in order to manufacture a display substrate, a metal layer is formed on a base substrate. A first photoresist pattern is formed on the metal layer. A first fine photo pattern is formed by ashing the first photoresist pattern. A signal line is formed by patterning the metal layer exposed through the first fine photo pattern. A pixel electrode is formed in a pixel area on the base substrate, and the pixel electrode is electrically connected to the signal line.

In an exemplary embodiment of the present invention, in order to manufacture a display substrate, a plurality of signal lines is formed on a base substrate and a switching element is connected to the signal lines. A transparent conductive layer making contact with the switching element is formed. A photoresist pattern is formed on the transparent conductive layer formed on a pixel area of the base substrate. A fine photo pattern is formed by ashing the photoresist pattern. A pixel electrode comprising a fine electrode having a bar shape is formed by etching the transparent conductive layer exposed through the fine photo pattern.

For example, the photoresist pattern may include a first thickness part and a second thickness part thicker than the first thickness part, wherein the first thickness part is removed by ashing the photoresist pattern.

In an exemplary embodiment, the photoresist pattern may include a plurality of openings exposing the transparent conductive layer, and the widths of the openings may be expanded by ashing the photoresist pattern.

According to an exemplary embodiment of the present invention, there is provided a method of manufacturing a display substrate. In the method, an insulation layer is formed on a base substrate having a metal pattern formed thereon. A photoresist pattern is formed on a base substrate having the insulation layer formed thereon. A photoresist pattern includes a first thickness part formed in an area opposite to a portion of the metal pattern and a second thickness part thicker than the first thickness part. A fine photo pattern from which the first thickness part has been removed by ashing the photoresist pattern is formed. A contact hole is formed by removing the insulation layer exposed through the fine photo pattern. A pixel electrode that makes contact with the metal pattern exposed through the contact hole and that is subsequently to be electrically connected to the metal pattern is formed.

According to a method of fine patterning a thin film and a method of manufacturing the display substrate by using the same of an exemplary embodiment of the present invention, a fine photo pattern is formed to have a reduced height and/or width through an ashing of a photoresist pattern. A thin film is etched by using the fine photo pattern to form a pattern having a higher resolution than that of an exposure apparatus. Therefore, the reliability of a process for manufacturing a display substrate and the display quality of a display device may be improved.

BRIEF DESCRIPTION OF THE DRAWINGS

Exemplary embodiments of the present invention will be understood in more detail from the following descriptions taken in conjunction with the accompanying drawings.

DETAILED DESCRIPTION OF EXEMPLARY EMBODIMENTS

The present invention is described more fully hereinafter with reference to the accompanying drawings, in which exemplary embodiments of the present invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the present invention to those of ordinary skill in the art.

Hereinafter, exemplary embodiments of the present invention will be explained in detail with reference to the accompanying drawings.

Figure 1A:
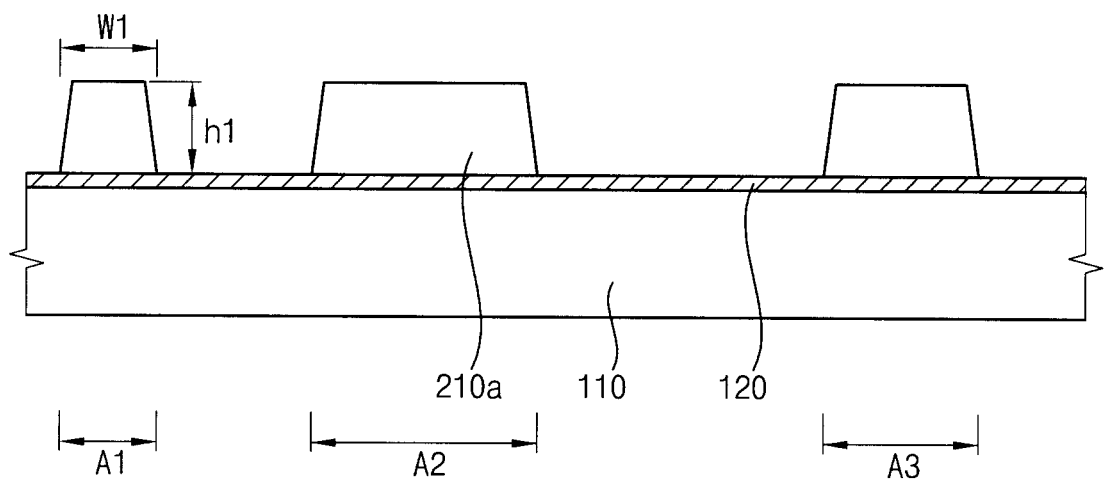
FIGS. 1A, 1B, 1D, 2A, 2B, 2D and 3B are cross-sectional views illustrating a method of forming a display substrate according to an exemplary embodiment of the present invention.

FIGS. 1A, 1B, 1D, 2A, 2B, 2D and 3B are cross-sectional views illustrating a method of forming a display substrate according to an exemplary embodiment of the present invention. FIGS. 1C, 2C and 3A are plan views illustrating a method of forming a display substrate according to an exemplary embodiment of the present invention. For example, FIG. 1A is a cross-sectional view illustrating a method of forming a first photoresist pattern.

Referring to FIG. 1A, a gate metal layer 120 is formed on a base substrate 110.

The gate metal layer 120 may be formed on the base substrate 110 through a sputtering process. The gate metal layer 120 includes, for example, at least one of aluminum (Al), molybdenum (Mo), neodymium (Nd), chromium (Cr), tantalum (Ta), titanium (Ti), tungsten (W), copper (Cu), silver (Ag), or an alloy thereof. Alternatively, the gate metal layer 120 may be formed to have a double-layer or triple-layer structure in which metal layers are stacked thereon, and the physical properties of the metal layers are different from each other.

Then, a first photoresist pattern 210a is formed on the base substrate 110 having the gate metal layer 120 formed thereon. The first photoresist pattern 210a is formed on the gate metal layer 120 corresponding to an area in which a gate pattern including a gate line GL (see FIG. 1C), a storage line STL (see FIG. 1C) and a gate electrode GE (see FIG. 1C) may be formed.

Hereinafter, an area in which the gate line GL is formed on the base substrate 110 will be defined as "a gate line part A1," the metal layer 120 of the area in which the gate electrode GE is formed will be defined as "a gate electrode part A2," and an area in which the storage line STL is formed will be defined as "storage line part A3."

In this exemplary embodiment, "a first width $w_1$" as shown in FIG. 1A is for comparing with a second width $w_2$ of the first fine photo pattern 210b, when the first photoresist pattern 210a of the gate line part is a first fine photo pattern 210b, in the following process. Thus, the first width $w_1$ does not represent a specific value. Moreover, the first width $w_1$ and the second width $w_2$ are defined as a length corresponding to a width 'x' (see FIG. 1C) of the gate line GL, and the width 'x' of the gate line GL is substantially perpendicular to the extended direction of the gate line GL.

According to the width of the gate line GL, the width of the gate electrode GE, and the width of the storage line STL, the width of the first photoresist pattern 210a formed on the gate line part A1, the width of the first photoresist pattern 210a formed on the gate electrode A2, and the width of the first photoresist pattern 210a formed on the storage line part can be different from each other.

The first photoresist pattern 210a on the gate line part A1 may have a first width $w_1$. The first width $w_1$ may be wider than that of the gate line GL. A value of the first width $w_1$ may depend on the resolution of the exposure apparatus used in the exposure process forming the first photoresist pattern 210a. That is, as the exposure apparatus has a higher resolution, the first width $w_1$ may be smaller. In addition, the first photoresist pattern 210a may have a first height $h_1$ with respect to a surface of the gate metal layer 120, as shown in FIG. 1A.

A photoresist composition is coated on the base substrate 110 having the gate metal layer 120 formed thereon to form a first photoresist film (not shown). Light is irradiated onto the exposure mask (not shown) disposed on the first photoresist film. Subsequently, the first photoresist pattern may be formed by using a developing solution. The photoresist composition may be, for example, a positive photoresist film through which an irradiated portion is removed by a developing solution and in which a non-irradiated portion remains.

Figure 1B:
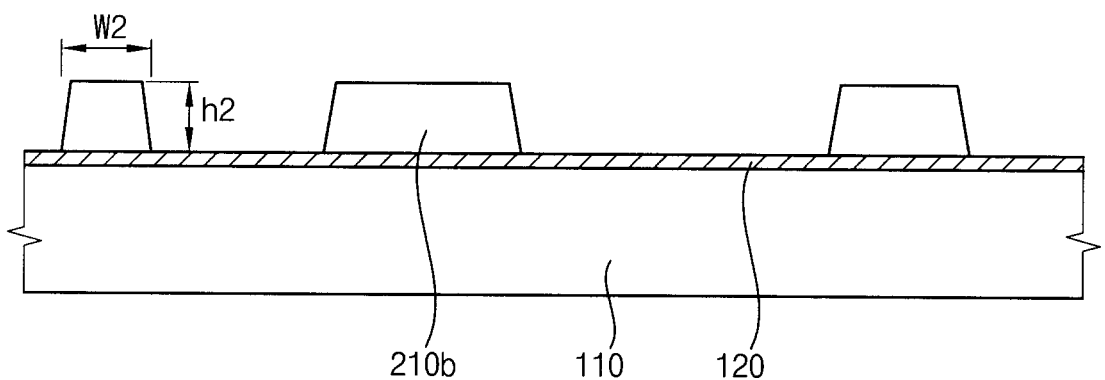
Figure 1C:
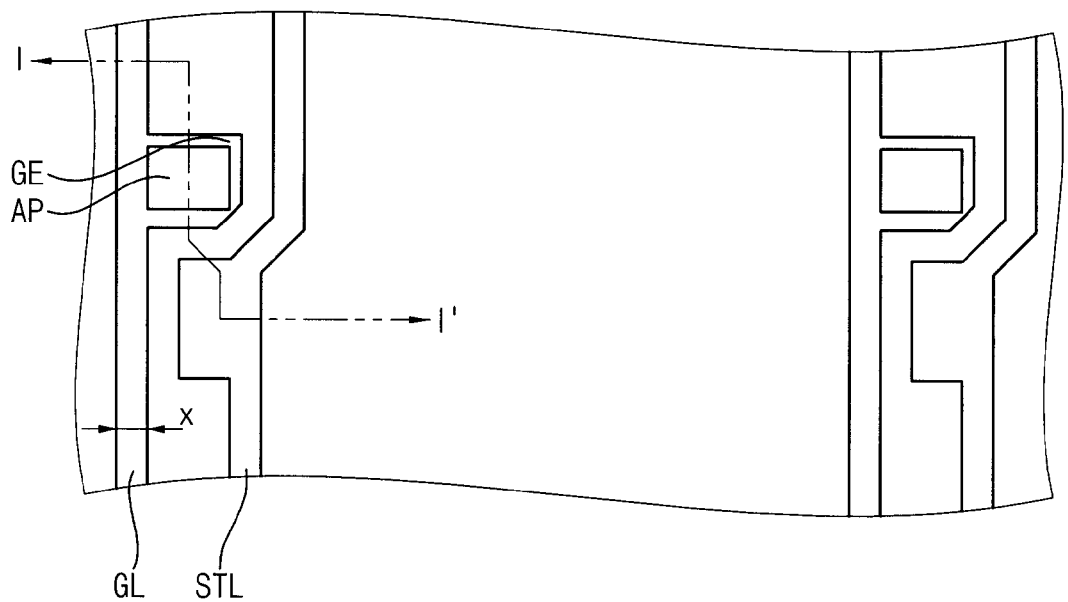
FIGS. 1C, 2C and 3A are plan views illustrating a method of forming a display substrate according to an exemplary embodiment of the present invention.

FIG. 1B is a cross-sectional view illustrating a method of forming a first fine photo pattern.

Referring to FIG. 1B, a first fine photo pattern 210b is formed by ashing the first photoresist pattern 210a.

The first fine photo pattern 210b may be formed by anisotropically etching the first photoresist pattern 210a. For example, the first photoresist pattern 210a may form the first fine photo pattern 210b by using oxygen ($O_2$) gas.

The first fine photo pattern 210b formed on the gate line part A1 may have a second width $w_2$. The second width $w_2$ may be narrower than the first width $w_1$. As a sidewall of the first photoresist pattern 210a is ashed, the second width $w_2$ of the first fine photo pattern 210a may become smaller than the first width w1 of the first photoresist pattern 210a.

The second width $w_2$ may depend on the flow rate of ashing gas, pressure, power and/or time used in the ashing process.

For example, as the power of the ashing process increases, the second width $w_2$ may become narrower. Similarly, as the ashing process time increases, the second width $w_2$ may become narrower. The first photoresist pattern 210a may be formed depending on the resolution of the exposure apparatus. The first fine photo pattern 210a may be formed independently of the resolution of the exposure apparatus. The second width $w_2$ that is smaller than the first width $w_1$ may be formed according to the control of the flow rate of ashing gas, pressure, power and/or time, so that limitations of the resolution of the exposure apparatus may be overcome.

For example, when the first photoresist pattern 210a is formed by using an exposure apparatus having a resolution of about 5 μm, the first width $w_1$ may be at least about 5 μm. The first fine photo pattern 210b having the second width $w_2$ may be formed through the ashing process, where the second width $w_2$ is at least about 0.1 μm smaller than the first width $w_1$. Thus, the second width $w_2$ may be about 0.1 μm to 4 μm smaller than the first width $w_1$.

Further, The first fine photo pattern 210b may have a second height $h_2$ based on the surface of the gate metal layer 120. The second height $h_2$ is lower than the first height $h_1$. As an upper part of the second photoresist pattern 210a is ashed, the second height $h_2$ of the first fine photo pattern 210b may become lower than the first height $h_1$ of the first photoresist pattern 210a.

Figure 1D:
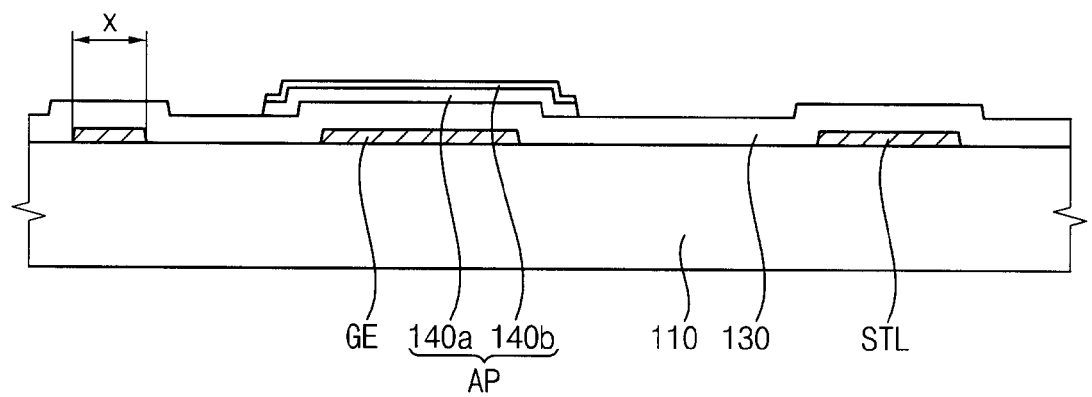

FIG. 1C is a plan view of a base substrate having a gate pattern and an active pattern formed thereon. FIG. 1D is a cross-sectional view taken along a line I-I' of FIG. 1C.

Referring to FIGS. 1C and 1D, the gate metal layer 120 is etched by using the first fine photo pattern as an etch-stop layer, and is then developed to form the gate pattern.

The gate pattern may include the gate line GL, the storage line STL, and the gate electrode GE connected to the gate line GL. A gate insulation layer 130 is formed on the base substrate 110 having the gate pattern formed thereon.

The gate line GL may be extended toward a first direction of the base substrate 110. A plurality of the gate lines is disposed in the second direction. For example, the second direction may be substantially perpendicular to the first direction.

A line width 'x' of the gate line GL is small in comparison with a line width obtained when forming the gate line GL by etching the gate metal layer 120 through the first photoresist pattern 210a as an etch-stop layer without the ashing process. Therefore, a line width 'x' of the gate line GL may be decreased by using the ashing process with the resolution of the original exposure apparatus. A line width 'x' of the gate line GL may be smaller than the second width $w_2$, or be substantially equal to the second width $w_2$. For example, a line width 'x' of the gate line GL may be greater than about 0.1 μm to less than about 5.0 μm.

For example, when oxygen ($O_2$) gas of about 400 sccm (standard cubic centimeters per minute) is supplied to a base substrate 110 having the first photoresist pattern 210a formed thereon, a processing pressure is about 100 mT, and processing power is about 1,000 W, an ashing process may be performed for about 45 seconds to form the first fine photo pattern. A line width may be decreased by about 1.3 μm to about 1.6 μm when the gate metal layer 120 is etched by using the first fine photo pattern 220a as an etch-stop layer, in comparison with a line width that is obtained when the gate metal layer 120 is etched by using the first photoresist pattern as an etch-stop layer.

The storage line STL may be substantially parallel with the gate line GL. The line width of the storage line STL may be decreased by using the ashing process with the resolution of the original exposure apparatus.

Then, an active pattern AP is formed on the base substrate 110 having the gate pattern formed thereon. For example, the active pattern AP is formed on the gate electrode GE. The active pattern AP may include a semiconductor layer 140a and an ohmic contact layer 140b. The semiconductor layer 140a may include amorphous silicon (a-Si). The ohmic contact layer 140b may include amorphous silicon (n+ a-Si) doped with n-type dopants at a high concentration.

Figure 2A:
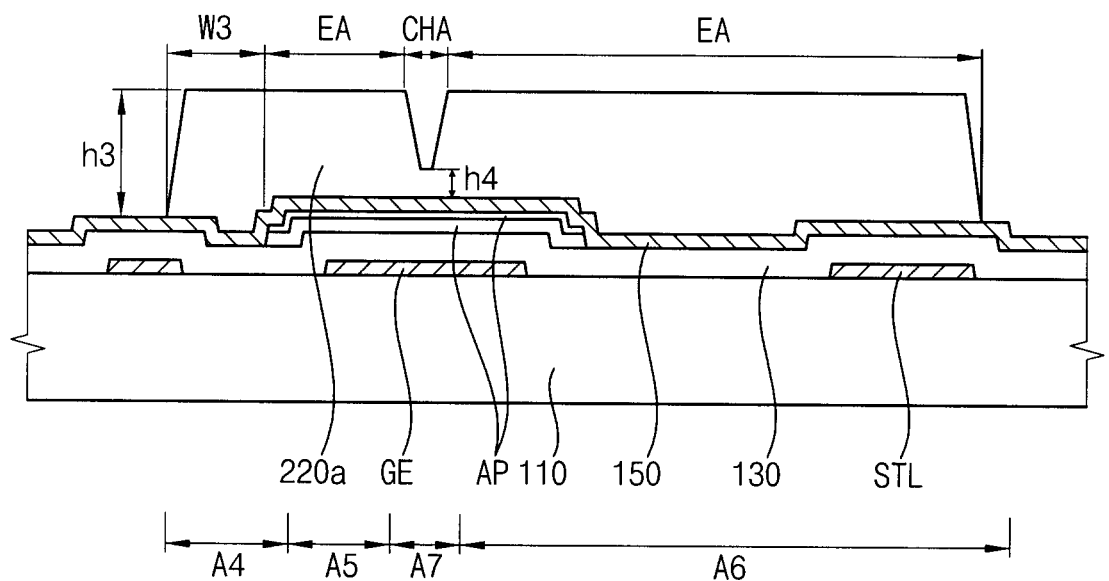
Figure 3A:
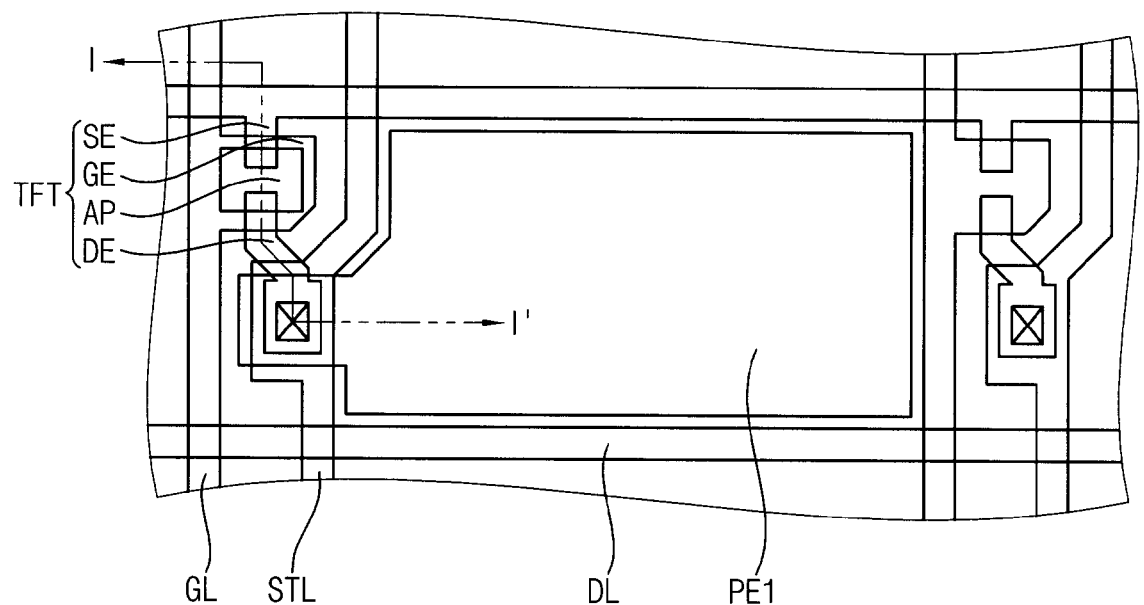

FIG. 2A is a cross-sectional view illustrating a method of forming a second photoresist pattern.

Referring to FIG. 2A, a source metal layer 150 is formed on a base substrate 110 having the active pattern AP formed thereon. The source metal layer 150, for example, may be formed on the base substrate 100 through a sputtering process. The source metal layer 150 includes, for example, at least one of copper (Cu), aluminum (Al), molybdenum (Mo), or an alloy thereof. Alternatively, the source metal layer 150 may be formed to have a double-layer or triple-layer structure in which metal layers are stacked thereon, and the physical properties of the metal layer are different from each other.

A second photoresist pattern 220a is formed on a base substrate 110 having the source metal layer 150 formed thereon. The second photoresist pattern 220a is formed on the source metal layer 150 corresponding to an area in which a source pattern including a data line DL (see FIG. 2C), a source electrode SE (see FIG. 2C) and a drain electrode DE (see FIG. 2C) may be formed.

Hereinafter, an area corresponding to the data line DL on the base substrate 110 will be defined as "data line part A4," and an area corresponding to the source electrode SE on the base substrate 110 will be defined as "source electrode part A5." An area corresponding to the drain electrode DE on the base substrate 110 will be defined as "drain electrode part A6," and an area in which the source electrode part and the drain electrode part are spaced apart from each other will be defined as "channel forming part A7." A third width $w_3$ and a fourth width $w_4$ will be defined as a length corresponding to a line width 'y' (see FIG. 2C) of the data line DL, and the third width $w_3$, and the fourth width $w_4$ are perpendicular to the extended direction of the data line DL.

The second photoresist pattern 220a formed on the data line part A4 may have a third width $w_3$. The third width $w_3$ may be wider than a line width 'y' of the data line DL. The second photoresist pattern 220b formed on the data line part A4 may have a third height $h_3$, as shown in FIG. 2A.

As shown in FIG. 2A, the second photoresist pattern 220a may include a partial residue part CHA formed on the channel forming part A7, and an entire residue part EA formed on the source electrode part A5 and the drain electrode part A6. The height of the entire residue part EA may be identical to the third height $h_3$ of the second photoresist pattern 210a formed on the data line DL. A switching element channel is formed in an area having the partial residue part CHA in a following process. A fourth height $h_4$ of the partial residue part CHA is lower than the third height $h_3$.

For example, the second photoresist film (not shown) is formed on the base substrate 110 having the source metal layer 150 formed thereon, and light is irradiated on the exposure mask (not shown) disposed on the second photoresist film. Subsequently, the second photoresist pattern 220a may be formed by a developing process. The mask (not shown) includes a partial exposure part. The second photoresist film on which irradiated light is irradiated through the partial exposure part may form the partial residue part CHA of the fourth height $h_4$ lower than the third height $h_3$ after a developing process.

Furthermore, when the second photoresist film is formed by using a positive photoresist composition, the second photoresist film of an area corresponding to the light-blocking portion of the mask remains on the source metal layer 150 after developing. The second photoresist film of an area corresponding to the light-transmitting portion of the mask is removed after developing to expose the source metal layer 150. Thus, the second photoresist film remains on the source metal layer 150 of the data line part A4, the source electrode part A5, and the drain electrode part A6 to form the entire residue part EA.

The width and height of the partial residue part CHA depend on the resolution of the exposure apparatus. The higher the resolution of the exposure apparatus, the more the width and height of the partial residue part CHA may be finely controlled.

Figure 2B:
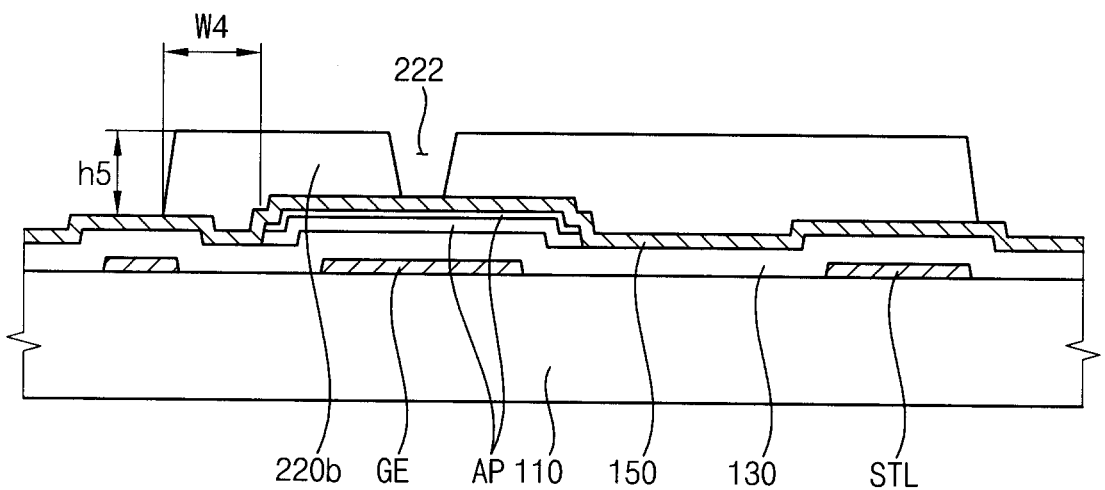
Figure 2C:
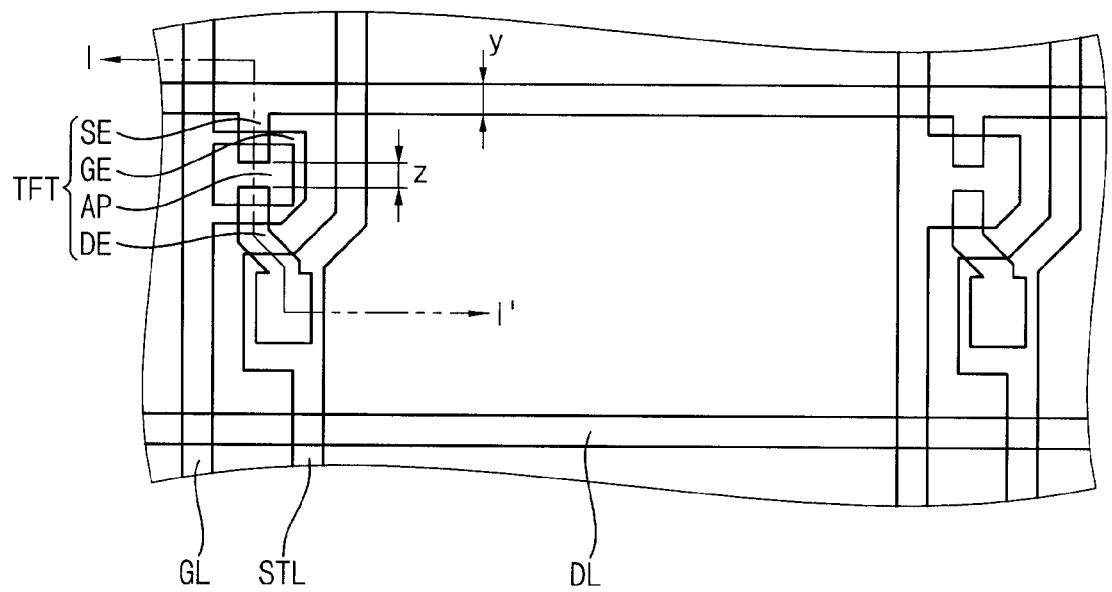

FIG. 2B is a cross-sectional view illustrating a method of forming a second fine photo pattern.

Referring to FIG. 2B, a second fine photo pattern 220b is formed by ashing the second photoresist pattern 220a.

A process for forming the second fine photo pattern 220b is identical to an ashing process for forming the first fine photo pattern 210b. Thus, any detailed explanation concerning a process for forming the second fine photo pattern 220b will be omitted.

The width of the second photoresist pattern 220a may be relatively reduced by the ashing process to form the second fine photo pattern 220b. The second fine photo pattern 220b on the data line part A4 may have a fourth width $w_4$ having a smaller width than that of the third width $w_3$. The partial residue part CHA is removed by the ashing process to form an opening of the second fine photo pattern 220b. The second fine photo pattern 220b may have a fifth height $h_5$ having a lower height than that of the third height $h_3$. The source metal layer 150 of the channel forming part A7 may be exposed through an opening 222 of the second fine photo pattern 220b.

Figure 2D:
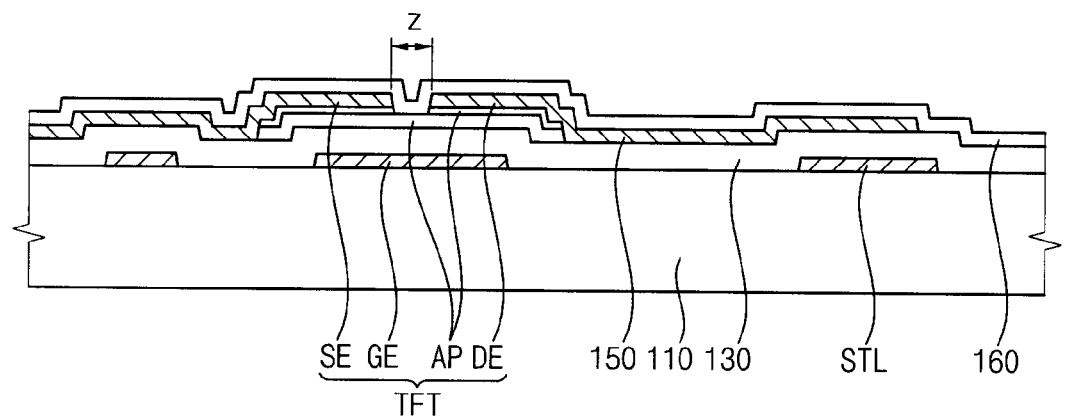

FIG. 2C is a plan view of a base substrate having a source pattern formed thereon. FIG. 2D is a cross-sectional view taken along a line I-I' of FIG. 2C.

Referring to FIGS. 2C and 2D, the source metal layer 150 is etched by using the second fine photo pattern 220b as an etch-stop layer, and is developed to form a source pattern. The source pattern includes the data line DL, the source electrode SE, and the drain electrode DE. The drain electrode DE may overlap a portion of the storage line STL.

The data line DL crosses the gate line GL formed on the base substrate 110. A line width 'y' of the data line DL is relatively smaller than the line width of the data line DL, in which the source metal layer 150 is etched by using the second photoresist pattern 220a as an etch-stop layer without the ashing process to form the data line DL. Thus, a line width 'y' of the data line DL may be reduced by using the ashing process independent of the resolution of the exposure apparatus. For example, a line width 'y' of the data line DL may be about 0.1 μm to 5.0 μm.

Then, the exposed semiconductor layer 140b of the active pattern AP is removed by using the second fine photo pattern 220b, the source electrode SE, and the drain electrode DE as an etch-stop layer.

Alternatively, a thin-film transistor (TFT), which is the switching element, includes the gate electrode GE, the active pattern AP, the source electrode SE and the drain electrode DEA channel of the TFT is formed on the channel forming part A7. A channel of the TFT may be defined as an area in which the source electrode SE and the drain electrode DE are spaced apart from each other. The channel is relevant to the electrical characteristics of the TFT. The longer the channel length is and the smaller a channel width z is, the more the electrical characteristics of the switching element TFT may be improved. The channel width z depends on the width of the partial residue part CHA of the second photoresist pattern 220a. In this exemplary embodiment, although the width of the partial residue part CHA depends on the resolution of the exposure apparatus to be formed, the channel width z may be finely controlled by forming the second fine photo pattern 220b through the ashing process.

Figure 3B:
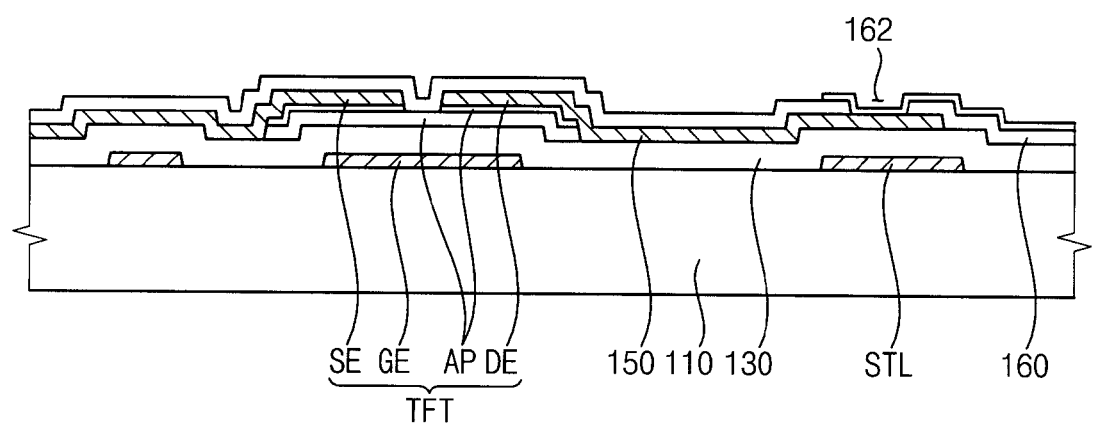

FIG. 3A is a plan view of a base substrate having a pixel electrode formed thereon. FIG. 3B is a cross-sectional view taken along a line I-I' of FIG. 3A.

Referring to FIGS. 3A and 3B, a protective insulation layer 160 is formed on a base substrate 110 having the TFT formed thereon. The protective insulation layer 160 is formed of an insulating material. The insulating material may include, for example, silicon nitride (SiNx), silicon dioxide (SiOx), and the like. The protective insulation layer 160 includes a contact hole 162 exposing a portion of the drain electrode DE.

A transparent conductive layer (not shown) is formed on a base substrate 110 having the protective insulation layer 160 formed thereon. The transparent conductive layer is patterned to form a first pixel electrode PE1. The transparent conductive layer is formed of transparent conductive material. The transparent conductive material may include, for example, indium tin oxide (ITO), indium zinc oxide (IZO), and the like. The first pixel electrode PE1 makes contact with the drain electrode DE through the contact hole 162 to be electrically connected to the TFT. The first pixel electrode PE1 is formed on a pixel area of the base substrate 110. For example, the pixel area may be an area where the gate line GL and the data line DL cross each other.

An organic layer (not shown) may be further formed between the protective insulation layer 170 and the first pixel electrode PE1 to planarize the base substrate 110.

In this exemplary embodiment, a fine photo pattern is formed by ashing a photoresist pattern through a patterning process of a gate metal layer and/or a data metal layer. A gate pattern and/or source pattern may be finely formed by patterning the gate metal layer and/or a data metal layer by using the fine photo pattern as an etch-stop layer. According to the above, a fine forming of the gate pattern and/or source pattern may realize a high resolution independent of that of the exposure apparatus originally used for forming the photoresist pattern.

For example, the ashing process for forming the fine photo pattern may have anisotropic etching properties, so that the width and height of the photoresist pattern may be uniformly reduced. Therefore, the uniformity of the fine photo pattern may be improved, and the uniformity of the gate pattern and/or the source pattern may be improved, which is formed by using the fine photo pattern as an etch-stop layer.

Figure 4A:
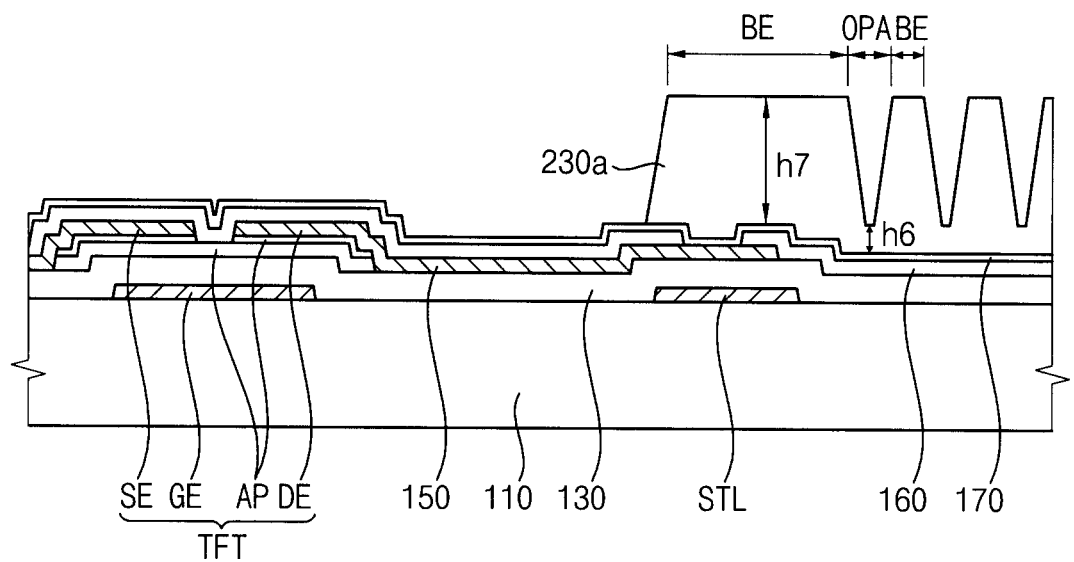
FIGS. 4A, 4B and 4D are cross-sectional views illustrating a method of forming a display substrate according to an exemplary embodiment of the present invention.
Figure 4B:
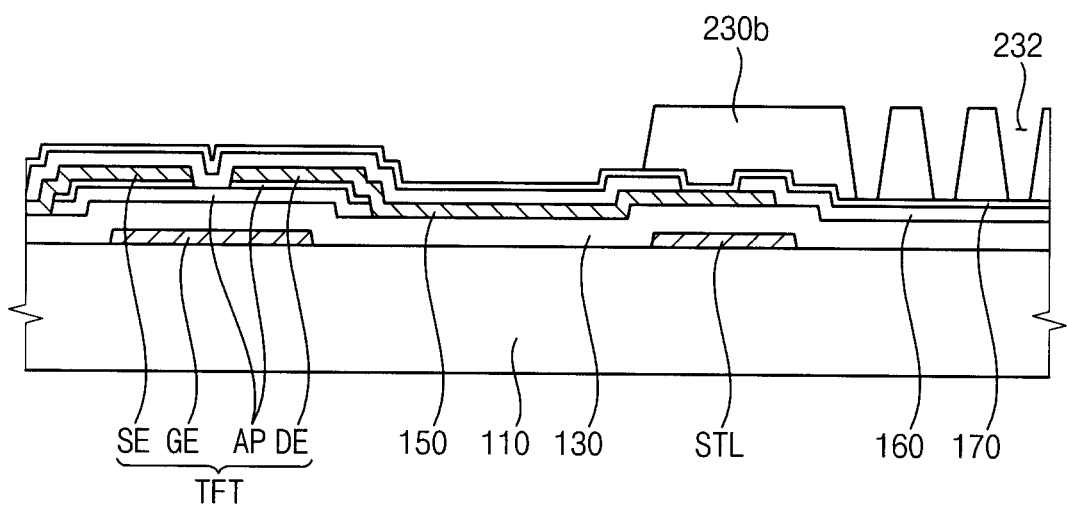
Figure 4C:
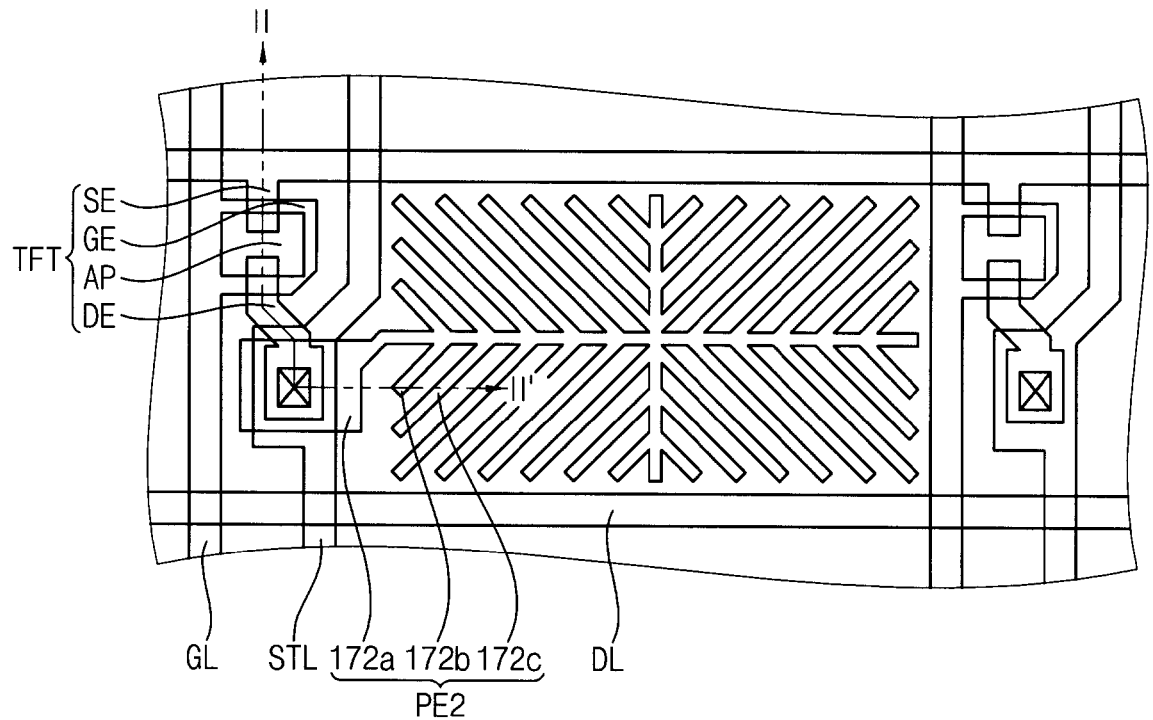
FIG. 4C is a plan view illustrating a method of forming a display substrate according to an exemplary embodiment of the present invention.
Figure 4D:
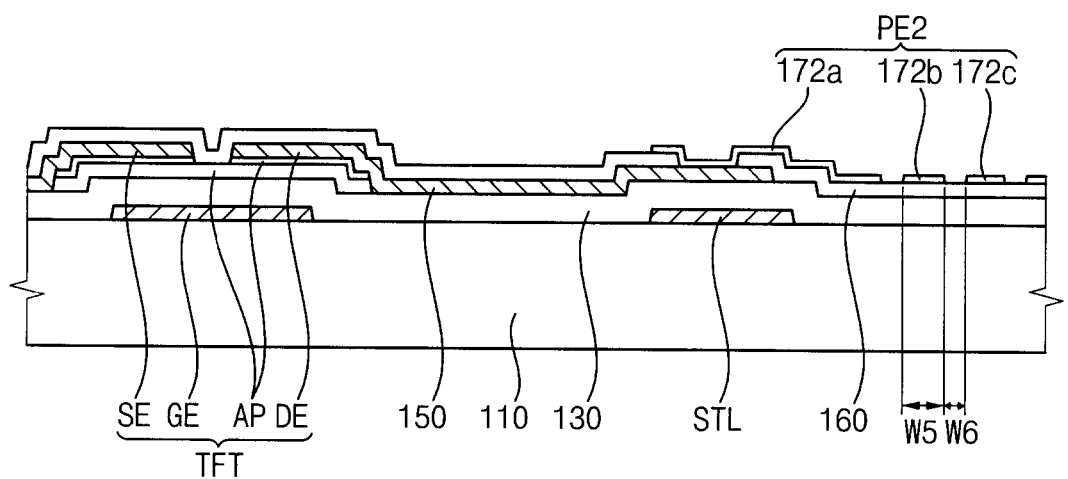

FIGS. 4A, 4B and 4D are cross-sectional views illustrating a method of forming a display substrate according to an exemplary embodiment of the present invention. FIG. 4C is a plan view illustrating a method of forming a display substrate according to an exemplary embodiment of the present invention.

In FIG. 4A, the step of forming a gate pattern, an active pattern and a source pattern of a display substrate according to this exemplary embodiment of the present invention is substantially identical to the steps of forming a gate pattern, an active pattern, and a source pattern of a display substrate according to an exemplary embodiment of the present invention as shown in FIGS. 1A, 1D, 2A and 2D. Thus, a further detailed explanation thereof will be omitted.

Referring to FIG. 4A, a protective insulation layer 160 and a transparent conductive layer 170 are formed on a base substrate 110 having a TFT formed thereon. For example, the transparent conductive layer 170 may include indium tin oxide (ITO), tin oxide (TO), indium zinc oxide (IZO), and the like.

A third photoresist pattern 230a is formed on a base substrate 110 having the transparent conductive layer 170 formed thereon. The third photoresist pattern 230a is formed on a pixel area of the base substrate 110.

For example, a third photoresist film is formed on a base substrate 110 having the transparent conductive layer 170 formed thereon, and is patterned by using a mask including a partial light-transmitting portion, a light-transmitting portion and a light-blocking portion to form the third photoresist pattern 230a. For example, the third photoresist film may be formed of a negative photoresist composition. When an amount of light passing through the light-transmitting portion is about 100% and an amount of light passing through the light-blocking portion is about 0%, an amount of light passing through the partial light-transmitting portion is between about 0% to about 100%. For example, the partial light-transmitting portion may transmit an amount of light of about 20%.

The third photoresist pattern 230a may include a plurality of first thickness parts OPA and a plurality of second thickness parts BE. The first thickness part OPA may be formed to a sixth height $h_6$ on the transparent conductive layer 170. The second thickness part BE may be formed to a seventh height $h_7$ having a higher height than that of the sixth height $h_6$ on the transparent conductive layer 170.

The width and height of the first thickness parts OPA depend on the resolution of the exposure apparatus exposing the third photoresist film. The higher the resolution of the exposure apparatus, the more the width and height of the first thickness part OPA may be finely controlled.

Referring to FIG. 4B, a third fine photo pattern 230b is formed by ashing the third photoresist pattern 230a.

A process for forming the third fine photo pattern 220b is identical to an ashing process for forming the first fine photo pattern 210b according to the above-described exemplary embodiment of the present invention. Thus, a further detailed explanation concerning a process for forming the third fine photo pattern 220b will be omitted.

The width of the third photoresist pattern 230a may be relatively reduced by the ashing process to form the third fine photo pattern 230b. The height of the third fine photo pattern 230b is lower than the height of the third photoresist pattern 230a. In addition, the first thickness parts OPA may be removed by the ashing process to form a plurality of openings 232 of the third fine photo pattern 230b. A portion of the transparent conductive layer 170 is exposed through each first opening 232 of the third fine photo pattern 230b.

Referring to FIGS. 4C and 4D, the transparent conductive layer 170 is etched by using the third fine photo pattern 230b as an etch-stop layer to form a second pixel electrode PE2 on the pixel area.

The second pixel electrode PE2 may include a contact part 172a making contact with a portion of the drain electrode DE and a plurality of fine electrodes 172b and 172c connected to the contact part 172a. The fine electrodes 172b and 172c may have a bar shape. That is, the transparent conductive layer 170 exposed by the first openings 232 of the third fine photo pattern 230b is removed to form the fine electrodes 172b and 172c having a fifth width $w_5$. The fine electrodes 172b and 172c are spaced apart from each other and define a slit of a sixth width $w_6$.

In this exemplary embodiment, the sixth width $w_6$ may be finely controlled independent of forming the first thickness part OPA depending on the resolution of the original exposure apparatus, so that the resolution of the slits may be improved. Moreover, the third fine photo pattern 230b having a uniformly reduced width and height is used in a forming process of a display substrate, so that the fine electrodes 172b and 172c and the slits of the second pixel electrode PE2 may be uniformly and finely formed.

Figure 5A:
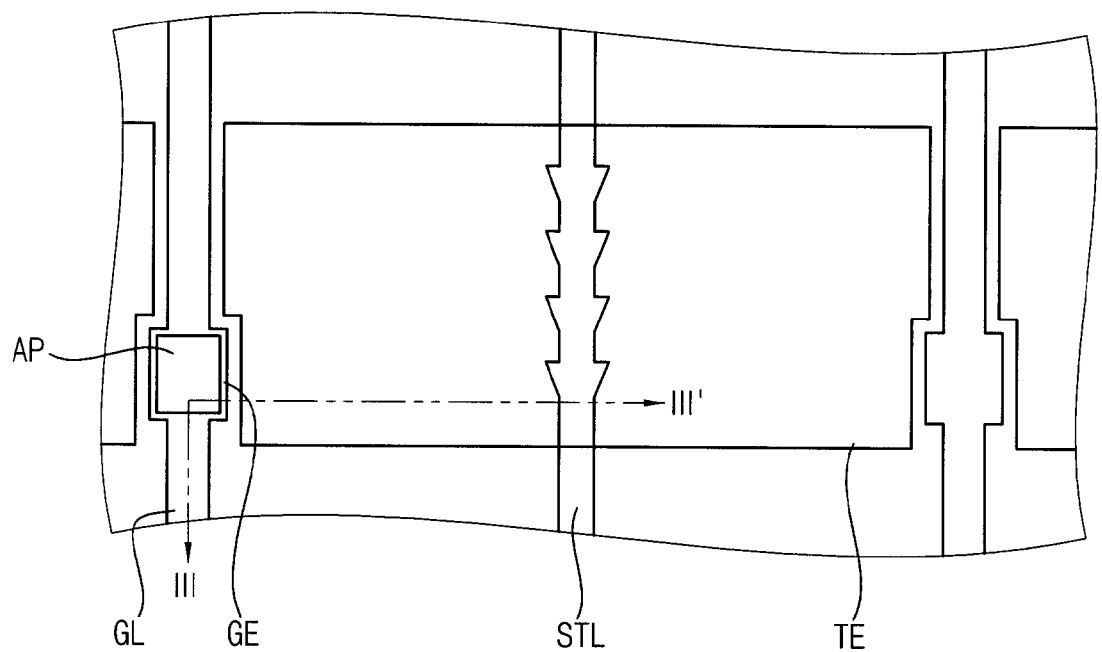
FIGS. 5A, 6A and 8C are plan views illustrating a method of forming a display substrate according to an exemplary embodiment of the present invention.
Figure 5B:
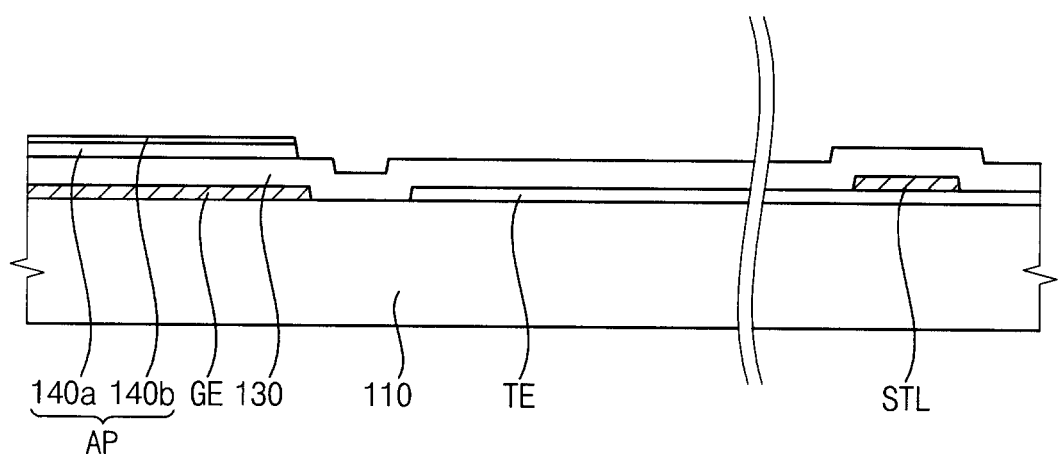
FIGS. 5B, 6B, 7A, 7B, 8A, 8B and 8D are cross-sectional views illustrating a method of forming a display substrate according to an exemplary embodiment of the present invention.
Figure 6A:
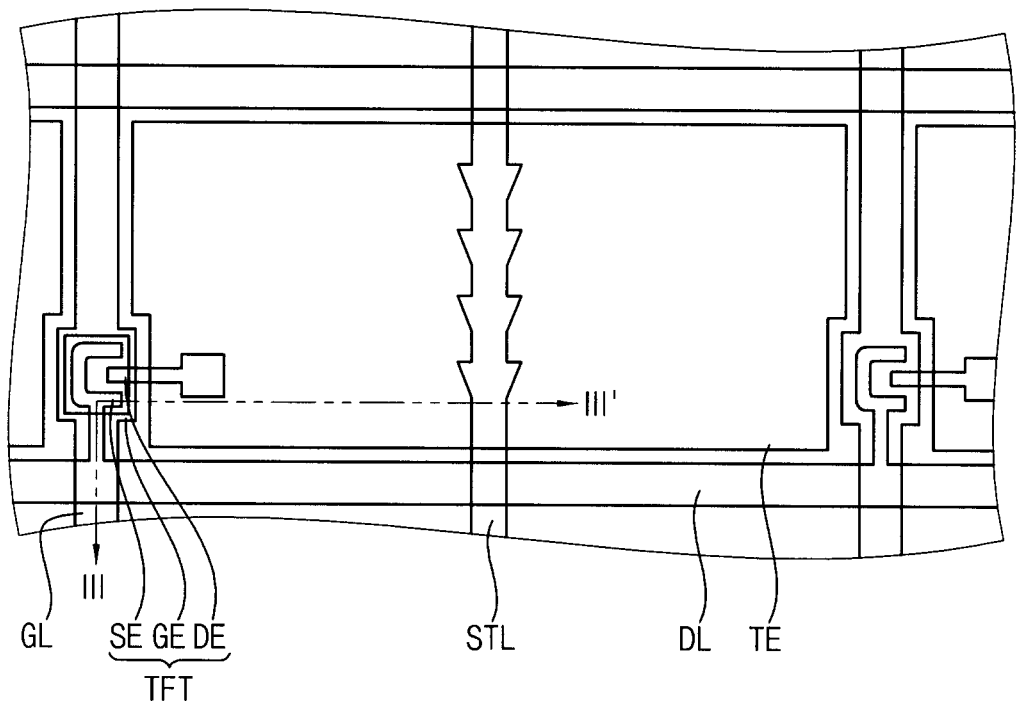
Figure 6B:
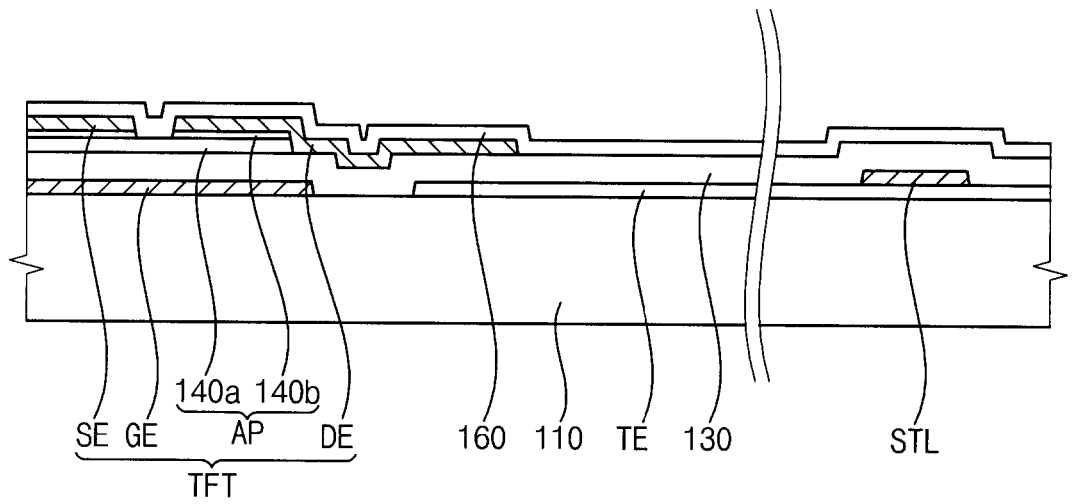
Figure 7A:
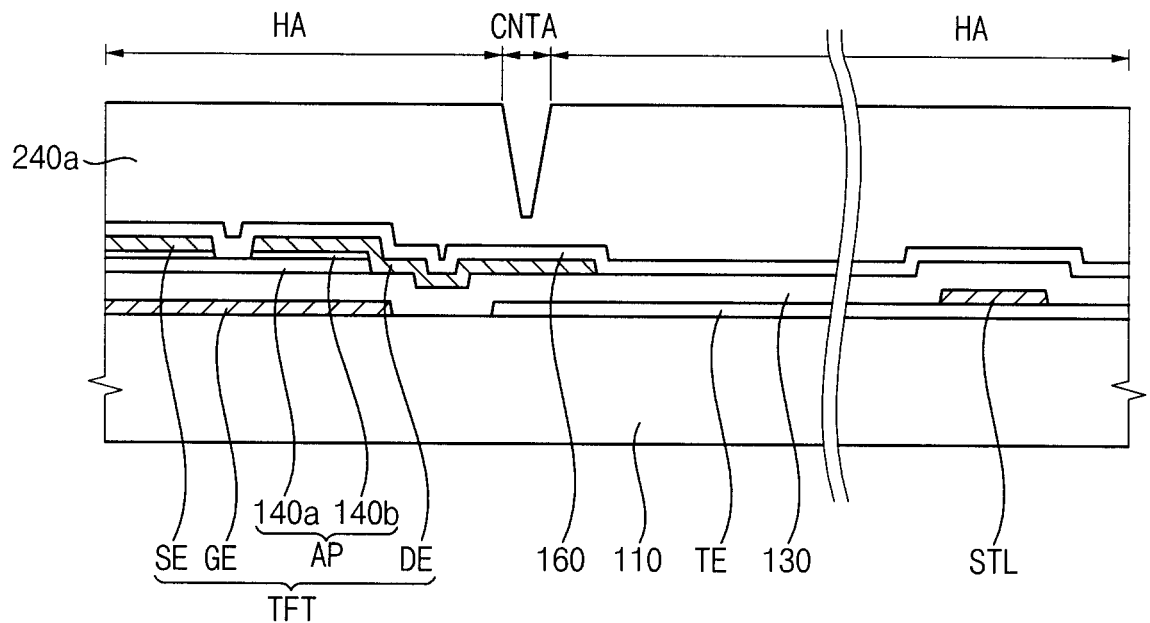
Figure 7B:
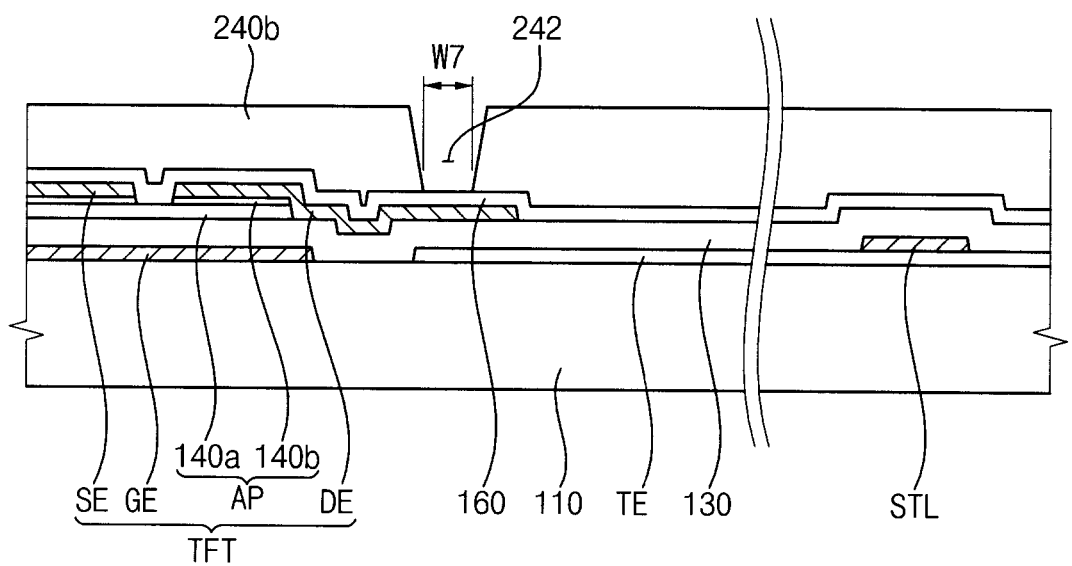
Figure 8A:
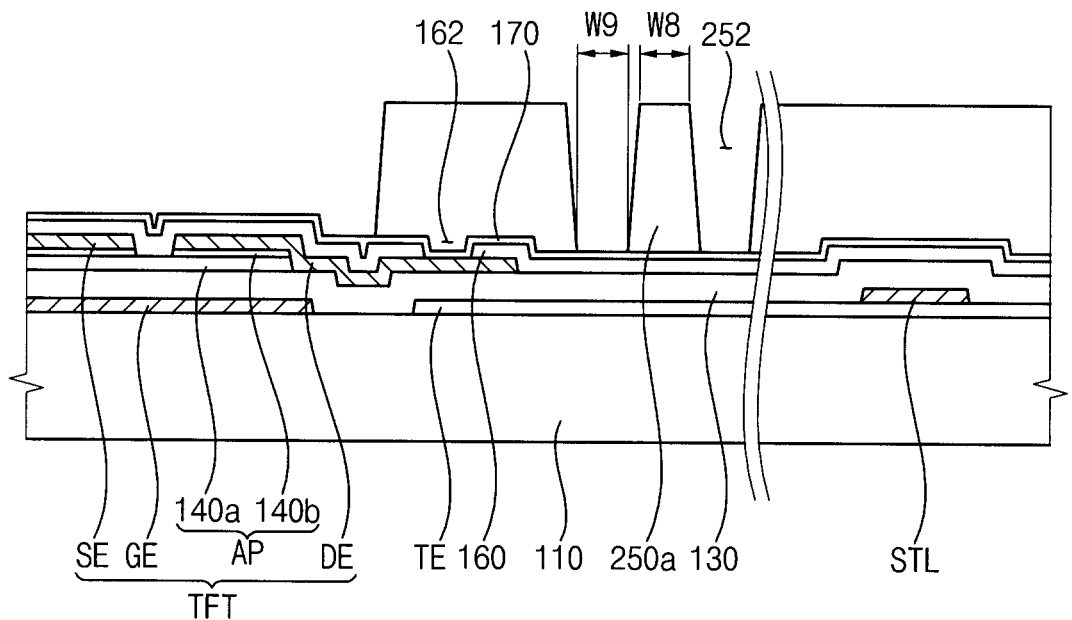
Figure 8B:
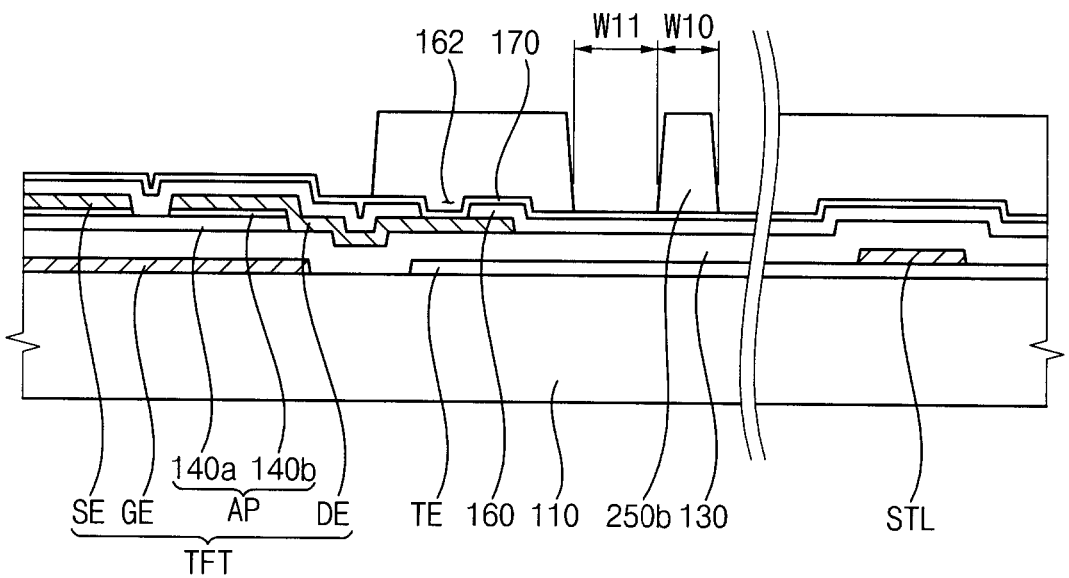
Figure 8C:
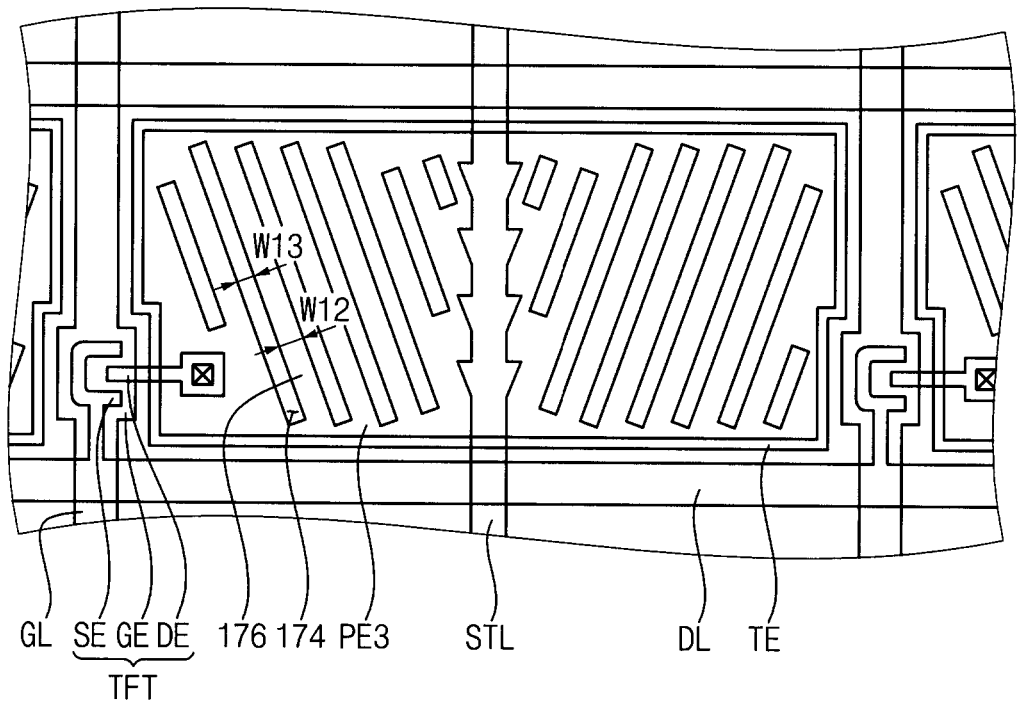

FIGS. 5A, 6A and 8C are plan views illustrating a method of forming a display substrate according to an exemplary embodiment of the present invention. FIGS. 5B, 6B, 7A, 7B, 8A, 8B and 8D are cross-sectional views illustrating a method of forming a display substrate according to this exemplary embodiment of the present invention.

FIG. 5A is a plan view of a base substrate having a common electrode and a gate pattern formed thereon according to this exemplary embodiment of the present invention.

Referring to FIGS. 5A and 5B, a first transparent conductive layer (not shown) is formed on a base substrate 110. The first transparent conductive layer is patterned to form a common electrode TE. The first transparent conductive layer may be formed of indium tin oxide (ITO), indium zinc oxide (IZO), and the like. The common electrode TE may be formed in an area of the base substrate 110. The area having the common electrode TE may be defined as a pixel area.

A gate metal layer (not shown) may be formed on a base substrate 110 having the common electrode TE formed thereon, and the gate metal layer is patterned to form a gate pattern. The gate pattern may include a gate line GL, a gate electrode GE connected to the gate line GL, and a storage line STL. The gate line GL may be formed at both sides of the common electrode TE. The storage line STL may be formed on the common electrode TE. The gate electrode GE does not overlap the common electrode TE.

For example, the gate line GL may be formed through a process identical to the process for forming a gate pattern according to the above-described exemplary embodiment of the present invention. Thus, the width of the gate line GL may be reduced independently of the resolution of an original exposure apparatus.

The storage line STL may have a sidewall having slanted portions with respect to the gate line GL. The sidewall portions of the storage line STL are formed in a slanted direction, so that liquid crystal molecules may be prevented from having a pretilt angle and being distorted by the storage line STL due to a plurality of opening portions 174 defined by slits of the third pixel electrode PE3 (see FIG. 8C) according to this exemplary embodiment of the present invention. For example, the slanted direction may be inclined to about 45° with respect to the gate line GL when viewed on a plan view, and the slanted direction may be identical to an extending direction of the opening portion 174 shown in FIG. 8C.

Then, a gate insulation layer 130 may be formed on a base substrate 110 having the gate pattern formed thereon.

An active pattern AP may be formed on a base substrate 110 having the gate insulation layer 130 formed thereon. The active pattern AP may include a semiconductor layer 140a and an ohmic contact layer 140b.

FIG. 6A is a plan view of a base substrate having a common electrode, a gate pattern and a source pattern formed thereon according to this exemplary embodiment of the present invention. FIG. 6B is a cross-sectional view taken along a line III-III' of FIG. 6A.

Referring to FIGS. 6A and 6B, a source metal layer (not shown) is formed on a base substrate 110 having the active pattern AP formed thereon. The source metal layer is patterned to form a source pattern.

The source pattern may include a source line DL crossing the gate line GL, a source electrode SE connected to the source line DL and a drain electrode DE spaced apart from the source electrode SE. A portion of the drain electrode DE may overlap the common electrode TE.

The data line DL may be formed through a process identical to the process for forming a source pattern according to the above-described exemplary embodiment of the present invention. Thus, the width of the data line DL may be reduced independently of the resolution of an exposure apparatus.

A protective insulation layer 160 may be formed on a base substrate 110 having the source pattern formed thereon.

FIG. 7A is a cross-sectional view illustrating a method of forming a fourth photoresist pattern.

Referring to FIG. 7A, a fourth photoresist pattern 240a may be formed on the protective insulation layer 160. The fourth photoresist pattern 240a may include a first thickness part CNTA formed on the protective insulation layer 160 at an area corresponding to a contact hole 242 (see FIG. 7B) and a second thickness part HA formed on the protective insulation layer 160 at an area excluding the contact hole 242. The height of the first thickness part CNTA may be lower than the height of the second thickness part HA.

A fourth photoresist film (not shown) is formed on the protective insulation layer 160, and is patterned by using a mask including a partial light-transmitting portion, a light-transmitting portion and a light-blocking portion to form the fourth photoresist pattern 240a. The fourth photoresist film may be formed of a positive photoresist composition.

The first thickness part CNTA may be formed so that the fourth photoresist film partially remains in an area corresponding to the partial light-transmitting portion. The width and height of the first thickness part CNTA depend on the resolution of an original exposure apparatus exposing the fourth photoresist film. The higher the resolution of the exposure apparatus, the more the width and height of the first thickness part CNTA may be finely controlled.

FIG. 7B is a cross-sectional view illustrating a method of forming the fourth fine photo pattern.

Referring to FIG. 7B, a fourth fine photo pattern 240b may be formed by ashing the fourth photoresist pattern 240a. A second opening 242 may be formed by removing the first thickness part CNTA through an ashing process. The protective insulation layer 160 is exposed through the second opening 242. The second opening 242 of the fourth fine photo pattern 240b may have a seventh width $w_7$.

FIG. 8A is a cross-sectional view illustrating a method of forming the fifth photoresist pattern.

Referring to FIG. 8A, the protective insulation layer 160 may be etched by using the fourth fine photo pattern 240b as an etch-stop layer to form a contact hole 162.

In this exemplary embodiment, the fourth fine photo pattern 240b may be formed by ashing the fourth photoresist pattern 240a, and the contact hole 162 may be formed by using the same. Thus, the width of the contact hole may be reduced. Specifically, a width when forming the contact hole 162 by using the fourth fine photo pattern 240b may be smaller than a width when forming a contact hole by using a photo pattern including an opening except an ashing process. As the width of the contact hole 162 is reduced, an aperture ratio in a pixel of substantially the same size may increase.

Then, a second transparent conductive layer 170 may be formed on a protective insulation layer 160 having the contact hole 162. A fifth photoresist pattern 250a may be formed on the second transparent conductive layer 170. The fifth photoresist pattern 250a may be formed on the second transparent conductive layer 170 on the common electrode TE. For example, the second transparent conductive material 170 may be formed of indium tin oxide (ITO), indium zinc oxide (IZO), and the like. The fifth photoresist pattern 250a may be formed of a positive photoresist composition. The fifth photoresist pattern 250a may be formed on a pixel area of the base substrate 110.

The fifth photoresist pattern 250a may expose a portion of the second transparent conductive layer 170. For example, the fifth photoresist pattern 250a may include a third opening 252 of a ninth width $w_9$. The fifth photoresist pattern 250a of an eighth width $w_8$ may be formed on the second transparent conductive layer 170. An eighth width $w_8$ and a ninth width $w_9$ may be defined depending on the resolution of the original exposure apparatus.

FIG. 8B is a cross-sectional view illustrating a method of forming a fifth fine photo pattern.

Referring to FIG. 8B, a fifth fine photo pattern 250b may be formed by ashing the fifth photoresist pattern 250a.

A process for forming the fifth fine photo pattern 250b is identical to an ashing process for forming the first fine photo pattern 210b according to the above-described exemplary embodiment of the present invention. Thus, a further detailed explanation concerning a process for forming the fifth fine photo pattern 250b will be omitted.

According to this exemplary embodiment the eighth width $w_8$ of the fifth photoresist pattern 250a may be reduced to a tenth width $w_{10}$ through the ashing process, and a ninth width $w_9$ of the third opening 252 may be increased to an eleventh width $w_{11}$. In addition, the height of the fifth fine photo pattern 250b may be lower than the height of the fifth photoresist pattern 250a.

The tenth width $w_{10}$ and the eleventh width $w_{11}$ of the fifth fine photo pattern 250b may be finely controlled independently of the eighth width $w_8$ and the ninth width $w_9$ of the fifth photoresist pattern 250a depending on the resolution of the original exposure apparatus.

Figure 8D:
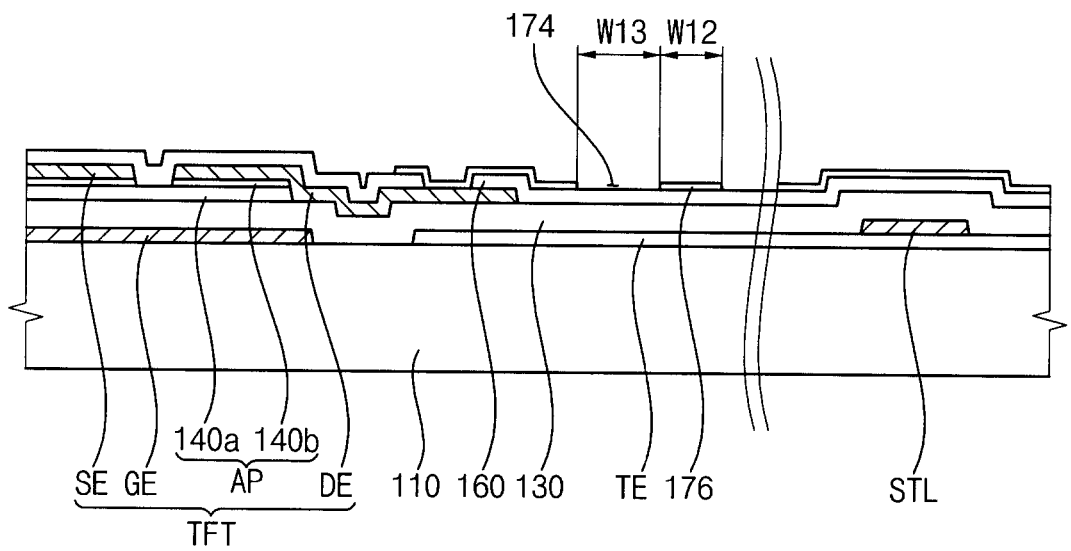

FIG. 8C is a plan view illustrating a method of forming a third pixel electrode. FIG. 8D is a cross-sectional view illustrating a method of forming the fifth photoresist pattern.

Referring to FIGS. 8C and 8D, the second transparent conductive layer 170 shown in FIGS. 8A and 8B is etched by using the fifth fine photo pattern 250b as an etch-stop layer to form third pixel electrode PE3. The third pixel electrode PE3 may be formed in the pixel area. The third pixel electrode PE3 may include a contact hole 162 shown in FIGS. 8A and 8B and an opening portion 174 shown in FIG. 8D. The opening portion 174 may be defined as a slit of the third pixel electrode PE.

A twelfth width $w_{12}$ having a smaller width than that of the tenth width $w_{10}$ of the second transparent conductive layer 170 remains by the fifth fine photo pattern 250b to form the fine electrode 176. The second transparent conductive layer 170 is removed to form the opening portion 174 corresponding to the third opening 252. A thirteenth width $w_{13}$ of the opening portion 174 may be wider than the eleventh width $w_{11}$.

In this exemplary embodiment, the twelfth width $w_{12}$ of the fine electrode 176 may be reduced, and the thirteenth width $w_{13}$ of the opening portion 174 may be increased. Thus, the reliability of controlling the transmissivity of liquid crystal molecules disposed on the opening portion 174 may be ensured by an electric field formed between the common electrode TE and the third pixel electrode PE3.

In this exemplary embodiment, the common electrode TE being formed between the base substrate 110 and the gate insulation layer 130 has been described as an example. The common electrode TE, however, may be formed on the protective insulation layer 160. Here, an insulation layer (not shown) may be further formed on the common electrode TE formed on the protective insulation layer 160. The third pixel electrode PE may be formed on a base substrate 110 having the insulation layer 130 formed thereon.

A method of fine patterning a thin film and a method of manufacturing a display substrate using the method of exemplary embodiments of the present invention are used for manufacturing a display substrate including a fine pattern having a higher resolution than that of the original exposure apparatus. Therefore, the reliability of a process for manufacturing a display substrate and, thus, the display quality of a display device may be improved.

Although exemplary embodiments of the present invention have been described, those of ordinary skill in the art will readily appreciate that many modifications are possible in the exemplary embodiments without materially departing from the novel teachings and advantages of the present invention.

The foregoing is illustrative of exemplary embodiments of the present invention and is not to be construed as limiting thereof. Although exemplary embodiments of the present invention have been described, those of ordinary skill in the art will readily appreciate that many modifications are possible in the exemplary embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims. The present invention is defined by the following claims, with equivalents of the claims to be included therein.

What is claimed is:

1. A method of manufacturing a display substrate, the method comprising:
   forming a first metal layer on a base substrate;
   forming a first photoresist pattern on the first metal layer, the first photoresist pattern having first photoresist pattern widths;
   forming a first fine photo pattern by ashing the first photoresist pattern to provide first fine photo pattern widths that are smaller than the first photoresist pattern widths;
   forming a first signal line by etching the first metal layer exposed through the first fine photo pattern;
   forming a first insulation layer on the base substrate having the first signal line formed thereon;
   forming a second metal layer on the first insulation layer;
   forming a second photoresist pattern on the second metal layer, the second photoresist pattern having a partial residue part, the partial residue part being thinner than other portions of the second photoresist pattern;
   forming a second fine photo pattern by ashing the second photoresist pattern to form an opening corresponding to the partial residue part;
   forming a second signal line by etching the second metal layer exposed through the second fine photo pattern; and
   forming a pixel electrode in a pixel area of the base substrate, the pixel electrode being electrically connected to the first or second signal line.

2. The method of claim 1, wherein a width of each of the first and second signal lines is about 0.1 µm to about 5.0 µm.

3. The method of claim 1, wherein forming the pixel electrode comprises:
   forming a transparent conductive layer on the base substrate having the first and second signal lines formed thereon;
   forming a third photoresist pattern on the transparent conductive layer of the pixel area, the third photoresist pattern comprising a plurality of first thickness parts and a plurality of second thickness parts thicker than the first thickness parts;
   forming a third fine photo pattern in which the first thickness parts are removed by ashing the third photoresist pattern; and
   forming a plurality of fine electrodes of a bar shape, which forms the pixel electrode, by removing the transparent conductive layer exposed through the third fine photo pattern.

4. The method of claim 1, wherein forming the pixel electrode comprises:
   forming a transparent conductive layer on the base substrate having the first and second signal lines formed thereon;
   forming a third photoresist pattern on the transparent conductive layer of the pixel area, the third photoresist pattern comprising a plurality of openings exposing the transparent conductive layer;
   forming a third fine photo pattern having the plurality of openings with expanded widths by ashing the third photoresist pattern; and
   forming a plurality of fine electrodes of a bar shape, which forms the pixel electrode, by removing the transparent conductive layer exposed through the third fine photo pattern.

5. The method of claim 4, further comprising: forming a common electrode disposed between the pixel electrode and the base substrate.

6. The method of claim 1, further comprising:
   forming a second insulation layer between a base substrate having the first and second signal lines formed thereon and the pixel electrode;
   forming a fourth photoresist pattern on the second insulation layer, the fourth photoresist pattern comprising a first thickness part and a second thickness part thicker than the first thickness part;
   removing the second thickness part to form a third fine photo pattern exposing a portion of the second insulation layer; and
   removing the second insulation layer exposed through the third fine photo pattern to form a contact hole.

7. The method of claim 1, wherein the partial residue part is formed by irradiating a portion of the second photoresist pattern and removing the portion by a developing solution.

* * * * *